(12) United States Patent
Mize

(10) Patent No.: US 6,328,456 B1
(45) Date of Patent: Dec. 11, 2001

(54) ILLUMINATING APPARATUS AND LIGHT EMITTING DIODE

(75) Inventor: John V. Mize, Akron, OH (US)

(73) Assignee: Ledcorp, Akron, OH (US)

( * ) Notice: Subject to any disclaimer, the term of this patent is extended or adjusted under 35 U.S.C. 154(b) by 0 days.

(21) Appl. No.: 09/534,768

(22) Filed: Mar. 24, 2000

(51) Int. Cl.[7] ....................................................... F21V 3/00
(52) U.S. Cl. ........................... 362/311; 362/800; 362/327
(58) Field of Search ..................................... 362/311, 800, 362/327, 328, 329, 256, 310, 363; 313/512

(56) References Cited

U.S. PATENT DOCUMENTS

| | | |
|---|---|---|
| 4,967,330 | 10/1990 | Bell et al. . |
| 5,289,082 | 2/1994 | Komoto . |
| 5,865,529 * | 2/1999 | Yan ........................................ 362/327 |
| 5,897,195 | 4/1999 | Choate . |
| 5,947,588 | 9/1999 | Huang . |

* cited by examiner

Primary Examiner—Sandra O'Shea
Assistant Examiner—Bao Truong

(74) Attorney, Agent, or Firm—Scott M. Oldham; Hahn, Loeser + Parks, LLP

(57) ABSTRACT

The present invention is directed to an LED lamp and method of using one or more lamps, and portable lighting products such as flashlights using such LED lamp(s). The LED lamp according to the invention provides uniformly distributed light that radiates spherically approximately 270° in all directions, both radially and axially. This newly designed lamp is ideally suited as a source of illumination for beam lights of the type employing reflective surfaces to produce a beam of light. The at least one chip is encased in at least one envelope surrounding the chip, with the envelope extending from a first position below the position of the at least one chip to a second position above the chip position. The second position of the envelope forms a lens in from of the at least one chip with the surface of the lens being configured and positioned relative to the ship such that a substantially uniform portion of light emitted from the chip is reflected off of the surface. In this manner, light is radiated spherically over an angle up to 270° relative to the chip position. In the preferred embodiment, the envelope is formed as a cylinder at its lower position and the lens is formed as a transitional surface extending from a position below the position of the chip at an angle or curvature inward from the cylindrical position to encase the chip.

24 Claims, 4 Drawing Sheets

ILLUMINATING APPARATUS AND LIGHT EMITTING DIODE

FIELD OF INVENTION

The present invention relates to an illumination apparatus and improved light emitting diode lamp (LED) having a unique configuration adapted to distribute radiated light energy over a wide viewing angle. More particularly an illumination apparatus using at least one LED to create a beam of light and an LED configured to direct light over a wide viewing angle and into a reflector to create a beam of light.

BACKGROUND OF THE INVENTION

Heretofore beam lights, such as flashlights and the like, have generally used an incandescent bulb and a reflective surface to create a beam type lighting pattern or a collimated beam of light for general purpose use as a source of illumination. The bulbs give off light in a spherical pattern which ensures that a significant amount of light is reflected off the reflective surface surrounding the bulb, to create a beam of light. While these incandescent bulbs provide relatively uniform sources of a broad, visible spectrum of light, there are several problems that exist when using these bulbs in applications such as in a flashlight.

Incandescent bulbs are relatively inefficient which results in large amounts of entrapped heat energy, shortened life of the bulbs, and relatively high energy consumption of the batteries. The light produced from the incandescent bulbs is generally yellow and gives a yellowish tint to anything viewed by the flashlight. The incandescent bulbs are fragile and susceptible to breaking due to shock loads such as when the flashlight is accidentally dropped. The bulb life can also be limited by hot and cold temperature as well as vibrational effects. Additionally, because incandescent bulbs are inefficient in operation, there are increased operating costs.

Most recently, semiconductor LED lamps have been used in flashlight applications. An LED is essentially a PN junction semiconductor diode that emits light when a current is applied. The LED is a solid state device which operates at a low current and produces negligible heat. The LED is encapsulated in a resin material which protects the device making it durable and long lasting. The use of conventional semiconductor light emitting diodes solves the problems of entrapped heat, lamp longevity, frequent lamp replacement and higher current operation.

However, the light produced by current LED bulbs have a limited effective range, the small viewing angle created by the diode projects the light in a fashion such that when used in a flashlight or like device, the majority of the light does not hit the reflective surface of the flashlight's reflector. In addition, when an LED is simply inserted in place of an incandescent bulb, the LED lamp life is shortened because the current applied is in excess of what the lamp was designed to operate at. In general, simple replacement with a conventional LED into a typical flashlight will operate at 100–120 mA, while LED's are typically designed to operate below 30 mA. Another problem that exists when using conventional light emitting diodes is that of a non-uniform distribution of emitted light energy.

Shown in FIG. 1 is a sectional view of a conventional LED lamp having one or more semiconductor chips 150. The transparent envelope 100 has a convex hemispherical shaped lens 120, located at the end of a cylindrically shaped rod 140. A semiconductor chip 150 is mounted to the conductive surface of the first electrode, LED anode 110, within the convex reflector 140. A fine wire 130 connects the opposite end of the semiconductor chip 150 to the second electrode 120. Also shown is the cone shaped light pattern 160 that is emitted from this LED device. A beam of visible light projects in a cone that ranges in angularity from 12 to 36° dependent upon the intended design usage.

The viewing angle 2 of the emitted light and visibility of the light produced by the diode 1 shown in FIG. 1 is relatively small making the device useful for indicators, and in some close range applications such as penlights or the like. In order to overcome this problem, some prior art devices use a cluster of LED's mounted together in an attempt to create stronger intensity light. These devices consume more energy, produce more heat, and are subject to produce dark spots due to averaging effects of the beams of light.

Therefore, there is a particular need for a light emitting diode lamp that provides a source of radiant energy that is adapted to distribute the radiated light energy onto a reflector to create a beam type lighting pattern and/or a collimated beam of light.

SUMMARY OF THE INVENTION

The present invention is directed to an LED lamp and method of using one or more lamps, and portable lighting products such as flashlights, lanterns, portable work lights, spotlights, vehicle headlights or other similar applications. The LED lamp according to the invention provides uniformly distributed light that radiates spherically at angles greater than 180°, for example up to approximately 270° in all directions, both radially and axially. This newly designed lamp is ideally suited as a source of illumination for beam lights of the type employing reflective surfaces to produce a beam of light.

The preferred embodiment of the LED lamp that radiates light uniformly in a spherical pattern comprises, at least one semiconductor chip coupled to a source of electrical power. The at least one chip is encased in at least one envelope surrounding the chip, with the envelope extending from a first position below the position of the at least one chip to a second position above the chip position. The second position of the envelope forms a lens in front of the at least one chip with the surface of the lens being configured and positioned relative to the chip such that a substantially uniform portion of light emitted from the chip is reflected off of the surface. In this manner, that light is radiated spherically over an angle greater than 180° and up to 270° relative to the chip position. Also, in the preferred embodiment, the envelope is formed as a cylinder at its lower portion and the lens is formed as a transitional surface extending from a position equal to or below the position of the chip at an angle or curvature inward from the cylindrical portion to encase the chip. It is also desirable that the angle of curvature of the surface at the position of the chip, be less than 70° with respect to the cylindrical surface of the lower portion. In the preferred embodiment, the lens is formed at a position directly above the chip, at a distance between greater than zero inches to about 0.1875 inches, and more preferably between about 0.030 inches to about 0.080 inches.

These and other advantages of the present invention will become more apparent upon further reading of the detailed specification. It should be understood that deviations or modifications can be made without deviating or departing from the spirit of the present invention.

DETAILED DESCRIPTION OF THE PREFERRED EMBODIMENT

Figure 2:
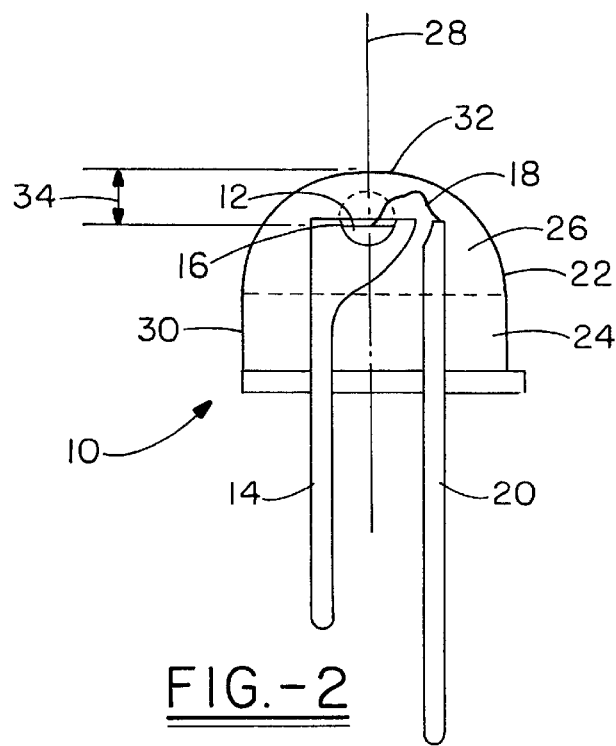
FIG. 2 is a sectional view of a LED lamp having a configuration in accordance with a first embodiment of the present invention.

The LED having a preferred configuration according to the present invention is shown in FIG. 2 as a sectional view of a LED lamp 10 having at least one semiconductor chip 12. The at least one semiconductor chip 12 is mounted to the conductive surface of the first electrode, the LED anode 14, which includes convex reflector 16. A fine wire 18 connects the opposite end of the semiconductor chip 12 to the second electrode 20. The at least one semiconductor chip 12 is generally encased in a transparent or translucent envelope 22 having a first portion 24 and a second portion 26. The first portion 24, is preferably cylindrically shaped and has a central axis 28 and a side wall 30. The second portion 26 is adjacent to the first portion 24 along the central axis 28, and comprises a reflective/refractive surface 32. In a first embodiment, the reflective/refractive surface 32 is hemispherically shaped. The at least one semiconductor chip 12 is positioned at a level which is equal to or above the interface between portions 24 and 26 such that the curvature of surface 32 extends equal to or below the level of chip 12 within the envelope. The chip 12 is further positioned at a predetermined distance 34 from the surface 32. Although not required, it is preferred that the at least one semiconductor chip 12 is positioned along the central axis 28.

Figure 3:
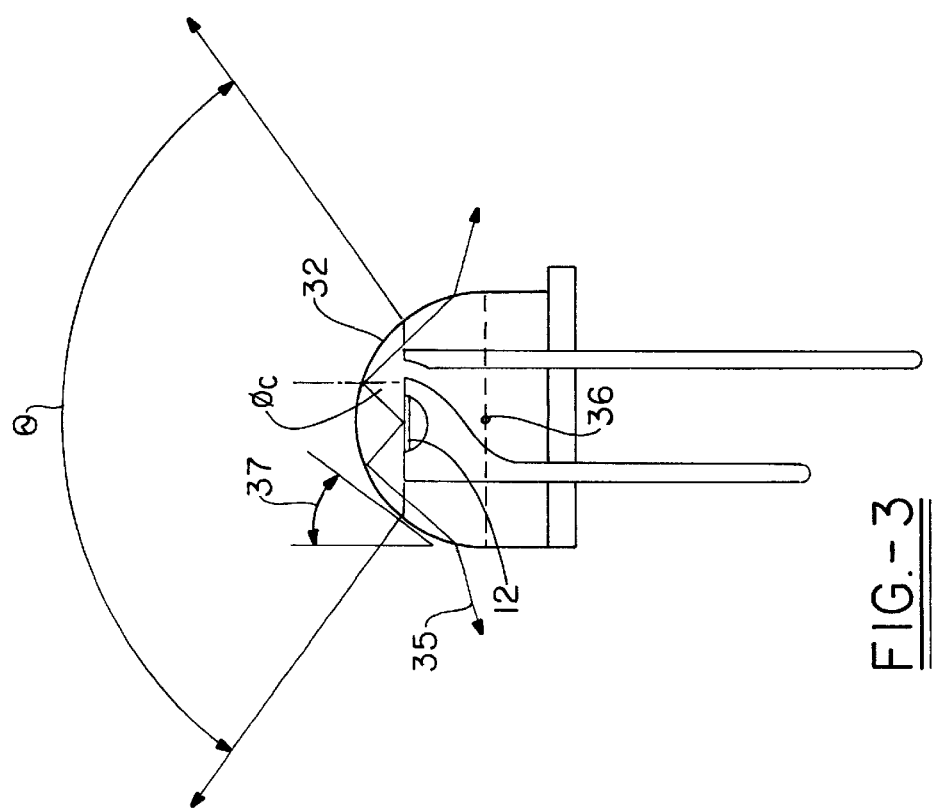
FIG. 3 shows the LED lamp of FIG. 2 and showing the typical pattern of light that is emitted from the LED lamp.

Referring now to FIG. 3, there is shown a sectional view of a LED lamp having a configuration in accordance with the present invention and various light rays emitted from the LED lamp. The recessed semiconductor 12 generally emits its brightest light in a hemispherical pattern as shown. When the light hits the surface 32, some of the light is refracted by the surface 32 to create a wide cone of intense light represented by angle θ. Additionally, due to the proximity of surface 32 to the semiconductor chip 12, surface 32 also forms a reflective surface for a significant portion of the light emitted from chip 12. As shown at 35, some light emitted from chip 12 is incident upon surface 32 at an angle which causes internal reflection of some or all of the light. In optics, the angle for total internal reflection relative to a surface is represented by the $\sin \emptyset_c = n/n'$, where n is the index of refraction of air or a first medium adjacent the boundary and n' is the index of refraction of the envelope or second medium adjacent the boundary. As light is emitted in all directions from chip 12, the configuration of the LED according to this embodiment results in a significant portion of light reflected off surface 32 and exiting in a direction toward the bottom of the LED as represented by the light path 35. The light path 35 should not be construed to be limiting in terms of the viewing angle achieved by the LED 10, but is merely representative for purposes of description. In general, the semiconductor chip 12 has a very high index of refraction, and the envelope 22 is generally designed to index match to greatly increase the amount of usable light emitted by the LED die.

It is further noted that although the surface 32 shown as spherical, other shapes may be suitable to create internal reflections according to the invention, such as a ellipsoidal, parabolic or aspheric surfaces. The surface 32 provides a refractive area of carefully controlled shape located in relative close proximity to the chip 12, as well as obtaining a controlled amount of internal reflection which is emitted toward the bottom of the LED 10 as desired. A viewing angle which extends well beyond 180° and up to 270° or more is thus generated, providing particular advantages for use in illumination apparatus in which the emitted light can be captured and focused uniformly. Such an illumination apparatus could include a flashlight, lantern, headlight or other vehicle light, recessed lighting or other environments where a reflector is used to capture and focus light. In such applications, it is desirable to fill the reflector with emitted light to result in a uniform beam of light having a relatively uniform intensity across the beam. Other reflector designs may disperse light in patterns other than a cylindrical beam, but in general the reflector may be used to capture and reflect light in a collimated manner.

Figure 4:
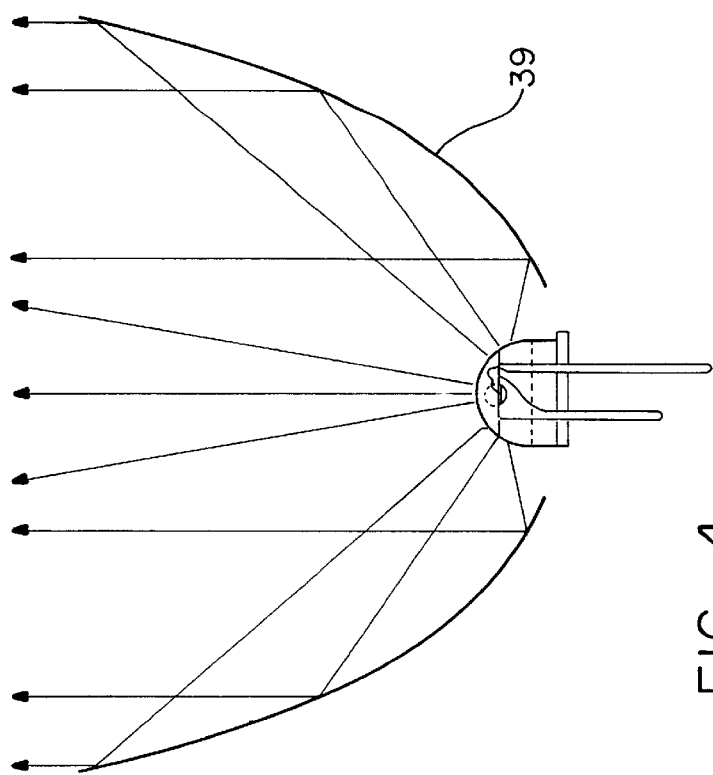
FIG. 4 shows a partial sectional view of a lighting apparatus including the LED lamp showing the typical pattern of the collimated beam of light produced by the flashlight.

Referring now to FIG. 4, in illumination apparatus using a reflector, such as in a flashlight, the preferred embodiment includes a distance 34 which again represents the distance between the chip 12, being the emitter of light and the surface 32 of the envelope 22. The distance 34 is preferably greater than zero up to about 3/16 of an inch, and more preferably between 0.02" to 0.060". These distances relate to forming the cylindrical section 30 to have a diameter in the range of 0.05" to 0.2", which is generally similar to commercial LED's such as manufactured by Nichia, under Model No. NSPW500BS or the like, which particularly has a diameter of 0.184". In the preferred embodiment shown, the spherical surface 32 is formed from center point 36, with the radius being in the range of 0.05 to 0.2", and more preferably between 0.1 to 0.125". In the embodiment shown, the height of the envelope, including sections 30 and surface 32 may vary significantly, but in the preferred embodiment, the height is in the range of 0.015" to 0.25", and in the embodiment shown, is approximately 0.2 to 0.25". Although these parameters have been identified as being preferred in the embodiment shown in FIGS. 2–3, various parameters can change without departing from the scope of the invention. For example, as LED chips are increased in size, the various parameters will generally increase correspondingly. For any particular LED chip and envelope configuration, these parameters can be identified to allow refraction of an amount of light so as to be directed generally forwardly from the LED lamp 10, as well as producing internal reflections so as to emit light in a direction generally toward the rear of the LED lamp 10. Additionally, in the preferred embodiment, the surface 32 extends to a position equal to or below the level of the chip 12 as shown. At a position 180° from the chip 12, discrete points on surface 32 will generally be disposed at an angle 37. The surface 32 preferably extends to a position equal to or below this point, such that light incident upon the surface 32 at or below the 180° level will also be incident upon surface 32. In the preferred embodiment, angle 37 is less than 70°, and in the embodiment shown is approximately 45°. The character of surface 32 in conjunction with its configuration about the location of the chip 12 provides both refracted and reflected light into fill as much of the reflective surface of a reflector 39 to produce a uniform beam of light having the intensity required for a flashlight as an example. As with incandescent bulbs, the semiconductor is generally located at the focal point of the parabolic reflector 39 shown such that the emitted rays will be reflected in a collimated manner. Alternatively, the reflector 39 could be formed in a different shape, such as spherical, elliptical or aspheric for desired applications. Further, the position of the lamp 10 relative to the reflector 39 can be varied to focus the beam emitted from the assembly at different focal points. Focusable flashlights are known for example, wherein the incandescent bulb and/or reflector is selectively moved to vary the focal point of the assembly, and the LED lamp 10 according to the present invention may also be used similarly.

Figure 5:
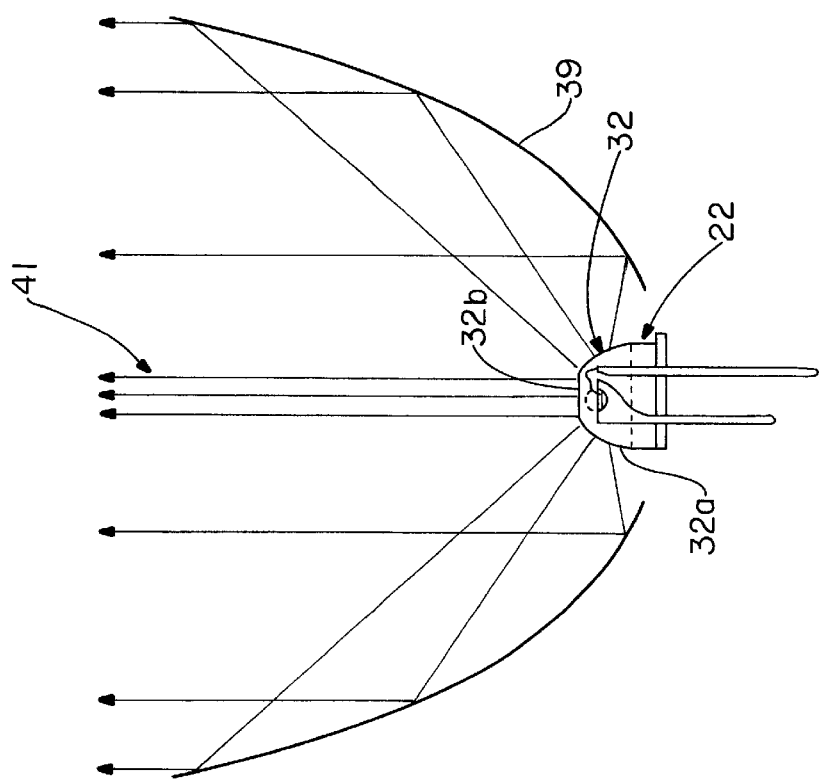
FIG. 5 is a sectional view of a LED lamp having an alternate configuration in accordance with the present invention.

In an alternate embodiment as shown in FIG. 5, the surface 32 of the LED 10 is configured to have a first generally curved section 32a and a generally planar portion 32b located at the upper portion thereof. The curved surface 32a may be spherical similar to the embodiment shown in FIGS. 3–5, or of another desired shape as referenced with respect to the previous embodiment, and again preferably extend to a position at or below the level of the chip 12. The planar surface 32b is generally positioned at the front of the envelope 22, and again is preferably positioned in proximity to the chip 12 in a manner similar to that previously described in the embodiment of FIGS. 2–4. The planar surface 32b tends to form collimated light rays as generally designated 41 out the front of the LED 10, while light is both refracted and reflected relative to curved section 32a so as to again disperse light relatively uniformly to fill a reflector 39, thereby again generating a uniform beam of high intensity. In the preferred form of the embodiment shown in FIG. 5, any interface between the curved section 32 and the remaining portions of the envelope 22 are preferably not discrete corners, but instead are smoothed or rounded slightly to more uniformly disperse light from the interface.

In the embodiment shown in FIGS. 2–5, if the illumination apparatus is a flashlight, the LED 10 can be suitably mounted in a conventional incandescent lamp base, such as a model RR2 lamp base, being of the screw-in type or equivalent. In a fixed focus flashlight, the LED 10 is properly positioned relative to the lamp base such that the light source is properly positioned at the focal point of the reflector 39 associated with the flashlight.

Figure 6:
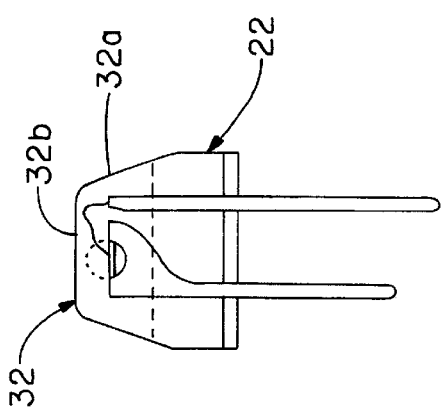
FIG. 6 is a sectional view of a further embodiment of the LED lamp according to the invention.

Another alternative embodiment is shown in FIG. 6, wherein the envelope 22 is designed having a surface 32 comprised of a first generally conical section 32a and a generally planar section 32b. Similar to the embodiment of FIG. 5, the planar section 32b generates substantially collimated light out of the front surface, in addition to reflecting an amount incident to thereon, while section 32a both refracts and reflects light to give the view angle characteristics as desired. Again in the preferred embodiment, the section 32a extends to a position at or below the level of the chip 12, such that light reflected from the surfaces and directed toward the rear of the LED 10 will be incident upon section 32a. Also in the preferred embodiment, similar to the embodiment of FIG. 5, it is preferable to smooth out or slightly round the interfaces between section 32a and adjacent surfaces.

Figure 7:
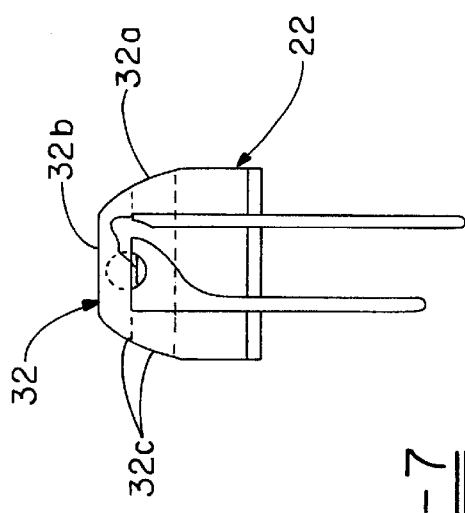
FIG. 7 is a sectional view of another embodiment of the LED lamp according to the invention.

Another alternative embodiment is shown in FIG. 7, wherein surface 32 again comprises sections 32a and 32b. In this embodiment, section 32a is comprised of a plurality of discrete planar surfaces 32c which are continuous with one another and angled relative to adjacent surfaces 32c such that section 32a extends inward to intersect with planar section 32b. The width of discrete surfaces 32c may be very small or larger depending upon other characteristics such as the configuration of a reflector in which the lamp is to be used or other factors. Forming the number of discrete surfaces 32 provides a different angle of reflection relative to light incident thereon, to again provide uniform distribution of light over an extremely wide view angle in the desired fashion.

Figure 9:
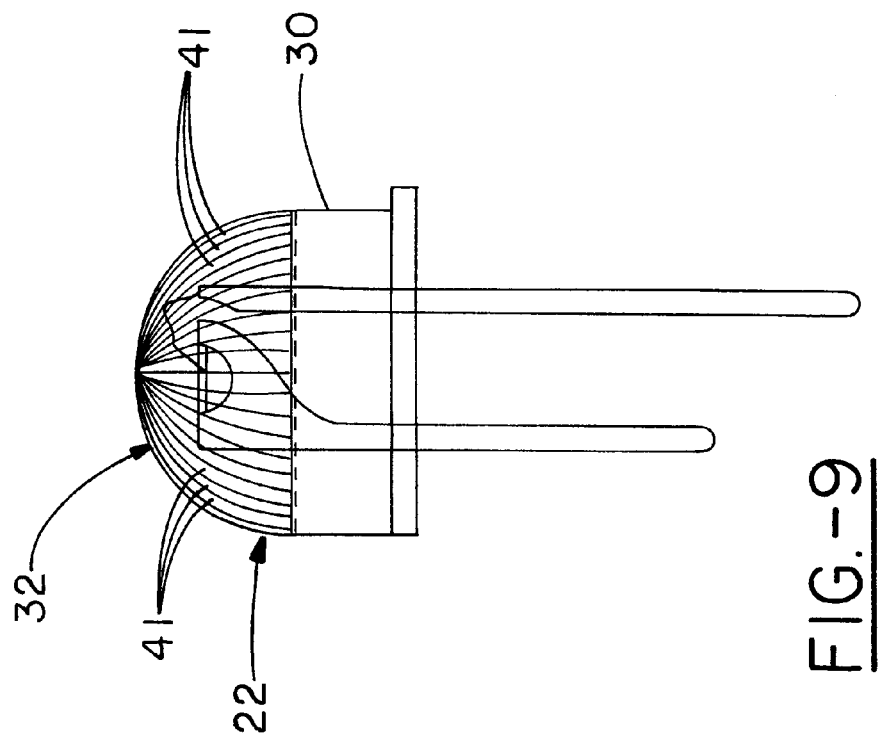
FIG. 9 is a side view of a further embodiment of the LED lamp according to the invention.
Figure 8:
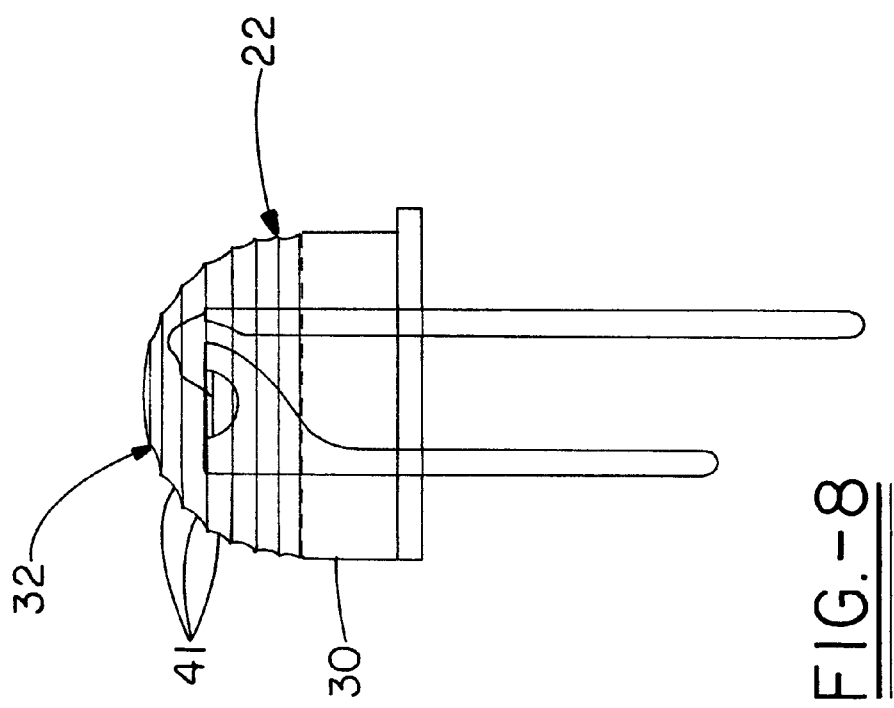
FIG. 8 is a side view of an embodiment of the LED lamp according to the invention.

Other alternatives of the lamp 10 according to the invention are shown in FIGS. 8 and 9, wherein surface 32 is generally spherical in shape, but is comprised of a plurality of facets 41 which extend either generally horizontally as shown in FIG. 8 or generally vertically as shown in FIG. 9, relative to section 30. Forming facets or grooves 41 within a generally spherical surface 32 again provides for a large number of differing reflective/refractive surfaces across the entire surface 32. In this manner, the light emanated from the chip 12 incident upon surface 32 will be refracted or reflected depending upon the particular incident angle at a point on surface 32, with the facets providing an increased number of surface configurations for the incident light. Uniform distribution of light over the extremely wide view angle is again achieved.

Figure 1:
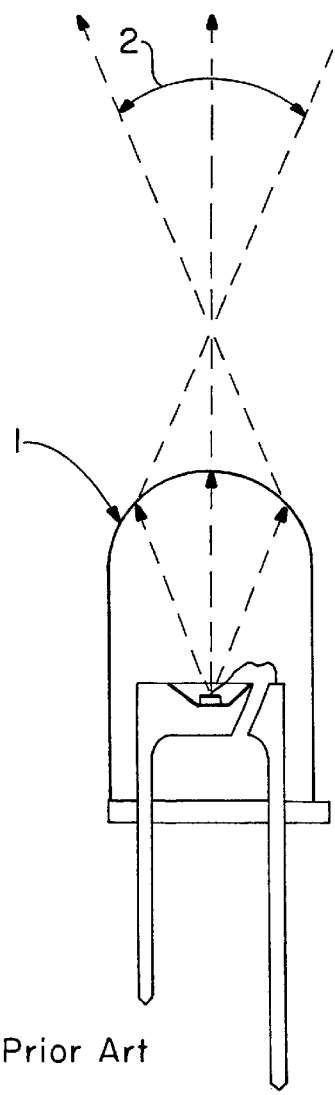
FIG. 1 is a sectional view of a conventional prior art LED lamp and shows the conical shaped pattern of light emitted from the LED lamp.

In each of the embodiments of FIGS. 2–9, the envelope 22 is formed of a transparent or translucent polymeric material. Typically, the material of which envelope 22 is made is easily molded into the proper configuration about the semiconductor chip 12 and associated electrodes and other structures. The chip 12 is thereby encapsulated within the material of envelope 22, providing the significant benefits as compared to incandescent bulbs as previously described. If the material is transparent or water clear, it may also be desirable for some applications to texture or otherwise create minor disconformities within the surface to facilitate refraction and reflection of light incident upon any portion of the surface in a manner to provide the wide view angle. Small disconformities or translucency in a particular point on the surface also tends to homogenize or make the light emitted from the LED 10 more uniform, and in turn homogenizes or makes the beam of light produced in conjunction with the reflector more uniform and less prone to forming bright or dark spots therein. The material from which envelope 22 is constructed may therefore include characteristics to more uniformly disperse light through the material, or have some translucency, texturing or the like introduced into the surface 32 in any suitable manner. As an alternative to molding the envelope 22 into the desired configuration, it is also possible to machine the envelope into the desired configuration by suitable grinding techniques. As an example, a Nichia LED Model No. NSPW500BS, previously mentioned as being a suitable semiconductor chip for use in the present invention, is formed in an envelope, and is configured similar to that of all prior art LED's such as shown in FIG. 1. A typical LED of this type may be modified to result in an LED construction according to the invention, such as by grinding a typical LED to the configuration as shown in the embodiments of FIGS. 2–9. As typical LED's include an envelope having a cylindrical side bottom portion 30, the surface 32 may be ground into the desired configuration using any suitable grinding techniques. Grinding may also result in minor disconformities or texturing of the ground surface, potentially resulting in benefits as described above. As an alternative to grinding away material to produce the desired surface 32 to generate internal reflections according to the invention, an LED envelope 22 may be originally configured, and thereafter encapsulated within a further envelope having the desired shape and dimensional characteristics to produce internal reflections according to the invention.

Figure 10:
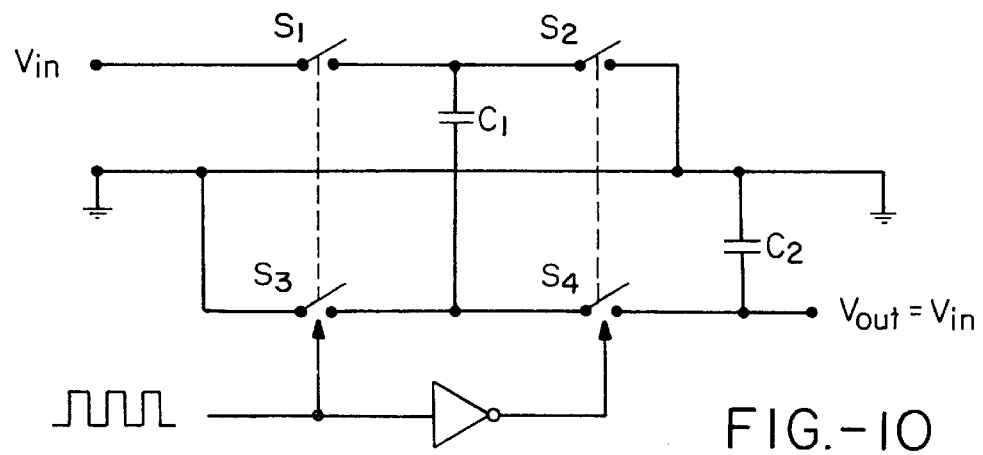
FIG. 10 is a schematic circuit diagram of a voltage doubler circuit which may be used in conjunction with a lighting apparatus including the LED lamp according to the invention.

Turning now to FIG. 10, a voltage doubler circuit is shown for use in an illumination device such as a flashlight, operating on battery power. In a typical flashlight manufactured for use with an incandescent bulb, the electrical requirements to operate the incandescent bulb are significantly different from the requirements to operate an LED lamp according to the present invention. It is therefore desirable to provide a voltage doubler circuit, such as shown in FIG. 10, to allow the use of a reduced number of batteries, and to provide an operating current to the LED lamp which minimizes over driving the lamp, which would result in reducing the life thereof. A suitable voltage doubler circuit such as shown in FIG. 1, has been reduced to an integrated circuit, such as produced by Harris Company Model No. ICL7660, relating to a CMOS voltage converter. Such an IC multiplies either positive or negative voltages by a factor of two, and can be considered a simple voltage doubler. The device in general operates by charging a pump capacitor to the input supply voltage and then applying the capacitor across the output supply, thereby transferring the necessary charge to an open-circuit storage capacitor. Alternatively, two or ore circuits may be used to extend or modify operation for a particular application. It may also be desirable to limit the current supplied by a battery power supply to be more compatible with the operating current of a typical LED lamp, and suitable resistors may be used to limit the current supplied to the semiconductor chip 12 accordingly.

It should also be evident that illumination devices according to the invention may include more than one LED lamp to increase the amount of light output from the device accordingly. Multiple LED's may be configured in the array which provides desired uniform light output of a desired intensity, wherein individual LED's in the array may be directed at similar or different angles relative to adjacent or other LED's in the array. It may also be possible to avoid interference between LED's in an array by providing some blocking structure between LED's or individual reflectors for each LED in the array which tend to shield each LED to minimize interference between emitted light. It may also be possible to use particular reflector configurations other than a smooth reflector as shown in the embodiments herein, such as the use of a faceted reflector or the like to also facilitate uniformity of the beam produced thereby.

It should be evident from the foregoing, that a wide variety of arrangements according to the present invention produce extremely wide view angle outputs from an LED lamp, and are particularly advantageously in applications where light is emitted to the incident on a reflector, which in turn focuses the light into a coherent pattern. Of a wide variety of other applications may also be enhanced by the characteristics of the LED lamp according to the present invention. While specific embodiments of the invention have been shown and described in detail to illustrate the principals of the invention, other modifications or variations can be made without departing from the true spirit and scope of the invention and their equivalence as defined in the following claims.

What is claimed is:

1. An LED lamp comprising at least one semiconductor chip coupled to a source of electrical power, said at least one chip being encased in at least one envelope surrounding said at least one chip, said at least one envelope having a first portion with a central axis and at least one side wall, and a second portion adjacent to said first portion, said second portion forming a lens in front of said at least one chip with the surface of said lens being configured and positioned relative to said at least one chip such that a substantially uniform portion of light emitted from said at least one chip is reflected off of said surface, such that light is radiated spherically over an angle greater than 180° relative to said chip position.

2. The LED of claim 1, wherein said chip is located at a position equal to or above the interface between said first and second portions at a predetermined distance from said surface of said second portion.

3. The LED of claim 1, wherein said surface is hemispherical.

4. The LED of claim 1, wherein said surface has at least one planar portion and at least one curved portion.

5. The LED of claim 1, wherein said first portion is cylindrically shaped.

6. The LED of claim 1, wherein said surface causes internal reflection of at least a portion of light incident thereon.

7. The LED of claim 1, wherein said chip is located at a position equal to or above the interface between said first and second portions.

8. The LED of claim 1, wherein said chip is located at a predetermined distance along the central axis from said surface of said second portion.

9. The LED of claim 8, wherein said predetermined distance is greater than zero up to approximately 3/16 of an inch.

10. The LED of claim 8, wherein the predetermined distance is approximately between 0.02 inches to 0.06 inches.

11. The LED of claim 1, wherein said surface of said second portion extends to a position at or below the position of said at least one chip at a point orthogonal to said central axis, and is angled with respect to said central axis at said point.

12. The LED of claim 11, wherein said surface is angled 70° or less at said point.

13. The LED of claim 1, wherein said surface is textured over at least a portion thereof.

14. The LED of claim 1, wherein the interface between said first and second portions is rounded.

15. The LED of claim 1, wherein said surface comprises a plurality of discrete surfaces which are continuous with one another.

16. The LED of claim 15, wherein said plurality of discrete surfaces comprise a plurality of planar surfaces.

17. The LED of claim 16, wherein said plurality of planar surfaces are angled with respect to one another.

18. The LED of claim 17, wherein said plurality of surfaces extend from a point on said surface along said central axis to the interface with said first portion.

19. The LED of claim 16, wherein said plurality of said surfaces extend generally orthogonal to said central axis.

20. The LED of claim 1, wherein said surface is translucent over at least a portion thereof.

21. The LED of claim 1, wherein a plurality of LED's are used in an LED array.

22. An illumination device comprising,
a source of electrical power, at least one LED lamp selectively coupled to said source of electrical power, said at least one LED having at least one semiconductor chip encased in at least one envelope surrounding said at least one chip, said at least one envelope having a first portion with a central axis and at least one sidewall, and a second portion adjacent to said first portion, said second portion forming a lens in front of said at least one chip with the surface of said lens being configured and positioned relative to said at least one chip such that a substantially uniform portion of light emitting from said at least one chip is reflected off said surface, such that light is radiated spherically over an angle greater than 180° relative to said chip position, and at least one reflector positioned relative to the location of said LED to capture light emitted from said LED and reflect said light in a predetermined manner.

23. The illumination device of claim 22, wherein said reflector is selected from the group consisting of spherical, parabolic, elliptical or aspheric.

24. The illumination device of claim 22, wherein the position of the at least one LED with respect to said reflector is variable.

* * * * *